United States Patent [19]
Gold

[11] 3,987,242
[45] Oct. 19, 1976

[54] AUTOMATIC DC RESTORER AND GAIN CONTROL

[75] Inventor: James J. Gold, Mountain View, Calif.

[73] Assignee: American Optical Corporation, Southbridge, Mass.

[22] Filed: Apr. 24, 1974

[21] Appl. No.: 463,496

[52] U.S. Cl. ............................. 178/6.8; 178/7.2; 178/7.5 DC; 178/DIG. 26
[51] Int. Cl.² .................... H04N 5/52; H04N 5/16
[58] Field of Search ........ 178/7.3 R, 7.3 DC, 7.1 R, 178/7.5 DC, 7.5 R, DIG. 26, DIG. 29, 7.2; 329/178, 179

[56] References Cited
UNITED STATES PATENTS

| | | | |
|---|---|---|---|
| 2,850,627 | 8/1958 | Moore et al. | 178/7.3 DC X |
| 3,179,743 | 4/1965 | Ahrons et al. | 178/7.5 R X |
| 3,515,803 | 6/1970 | Lorang | 178/7.5 DC X |
| 3,578,908 | 5/1971 | Tompkins | 178/7.2 |
| 3,597,540 | 8/1971 | MacIntyre | 178/7.3 R |
| 3,804,981 | 4/1974 | Avins | 178/7.3 DC X |

Primary Examiner—John C. Martin
Attorney, Agent, or Firm—H. R. Berkenstock, Jr.; William C. Nealon

[57] ABSTRACT

Apparatus for stabilizing the range of black to white level in a signal to a cathode ray tube, especially a signal produced by a detector in a charged particle microscope system. The stabilizing apparatus includes electronic circuitry for remembering the most negative (blackest) excursion of the signal for a predetermined time period, means for stabilizing all video input to that level and means for controlling the range of the signal (black to white) to remain within predetermined limits.

7 Claims, 3 Drawing Figures

AUTOMATIC DC RESTORER AND GAIN CONTROL

BACKGROUND OF THE INVENTION

The present invention relates generally to the display of information on raster scanned cathode ray tubes. A preferred embodiment of the invention is incorporated in a scanning electron microscope. While the features of applicant's invention are subject to a wide range of application, they will be specifically illustrated herein in the context of their application within the display system of a scanning electron microscope, and in particular, a field emission scanning electron microscope.

One of the very significant advantages of scanning electron microscopy systems is the inherent ability to directly view the investigated portion of a specimen on a cathode ray tube type monitor. This real time viewing of the specimen permits the practitioner to gain much valuable information. It may be appreciated that there will be many instances when it is not only desirable to view a selected specimen in real time, but also concurrently preserve the viewed image for investigation in greater detail at susequent times. In this latter regard, conventional scanning electron microscope systems offer camera attachments to the cathode ray tube monitors so that photographic records of the viewed images may be obtained.

It should be appreciated that in the preparation of a photographic record of an image being viewed that the highest degree of resolution be maintained. This is advantageous since the photographs are often further enlarged to take advantage of the high resolution of the photographic film. It should be further appreciated that in order to accomplish high resolution in the ultimate photograph, the visual presentation on the cathode ray tube from which the photographic record is prepared should be as stable and as free of "noise" as possible. This stability includes a satisfactory signal to noise ratio for intelligible transmission of information, a stability of picture information on the screen directly coordinated and synchronized with the scan of the electron beam of the scanning electron microscope across the surface of the specimen, and a stability in the contrast and brightness of the corresponding similar gray levels of different spots on the specimen's surface when interrogated by the electron beam. It is particularly with the latter in mind that the present invention was conceived.

Briefly, as illustrated in the figures and subsequently described in the specification, applicant's invention contemplates improvements to a field emission scanning electron microscope display system. A field emission gun generates a beam of charged particles which are accelerated and focused to impinge upon a specimen undergoing investigation. A detector suitably located with respect to the surface of the specimen produces an image signal relative to the impingement of the beam upon the specimen and the scattering of reflected electrons, secondary electrons and X-rays from the surface of the specimen. A viewing tube operatively associated with the detector displays an image of the specimen upon the sensitized face of the tube. This image is produced by the modulation of the viewing tube electron beam in accordance with the varying amplitude of the image signal being provided by the detector. A control synchronously deflects the charged particle beam of the electron microscope with the viewing tube beam in a predetermined scanning pattern. In the case of the systems where a photograph record is desired and wherein simultaneous real time viewing is preferred, the display system may include two cathode ray tube-type viewing tubes, the electron beams of which are both synchronously deflected in accordance with the charged particle beam of the electron microscope.

Among the features of the present invention is the electronic circuitry which is operatively associated with the viewing tube from which a photographic record of the image being investigated is produced. It is the function of this electronic circuitry to insure that the blackest or darkest portions of the specimen investigated by the charged particle beam of the electron microscope are correspondingly presented as the blackest or darkest portions on the viewing tube and correspondingly that the whitest portions of the investigated specimens are recorded on the viewing tubes as the whitest portions of the presented image.

It is also an object of the invention that the "blackest black" which is observed on the specimen's surface is continually remembered and observed on the viewing tube as the blackest black, and that all shades or gray levels above the black are simultaneously and immediately represented by a signal value corresponding to their relative relationship to the blackest black and further that the range from black to white as presented on the surface of the specimen is continually ranged during the period of investigation over the black to white range presented on the viewing tube.

SUMMARY OF THE INVENTION

In accordance with certain features of the invention, applicant describes improvements to electrical apparatus wherein a signal of varying amplitude such as the video input to a cathode ray tube which is supplied to recording means (such as the cathode ray tube) is biased and controlled so as to stabilize the display of information contained in the varying amplitude of said signal on the recording means. Included within the scope of the invention are means for monitoring the varying amplitude signal over a predetermined period of time, means for remembering the maximum amplitude of that signal within that period of time, means for generating a signal representing the maximum remembered value of the varying amplitude signal, means operatively coupled to the above-described means for biasing the varying amplitude signal relative to this maximum remembered amplitude signal so as to cause the instantaneous value of the varying amplitude signal to maintain a direct relation to the maximum remembered amplitude of the monitoring means. The invention also includes means for selecting a predetermined desired level of AC dynamic range of the varying amplitude signal, means for comparing the actual range of the varying signal to the predetermined desirable level and means for adjusting the dynamic range of the varying amplitude signal to conform to the predetermined desired level.

For better understanding of the present invention together with other further objects thereof, reference may be made to the following description of the preferred embodiment taken in conjunction with the accompanying drawings:

DESCRIPTION OF THE PREFERRED EMBODIMENT

Figure 1:
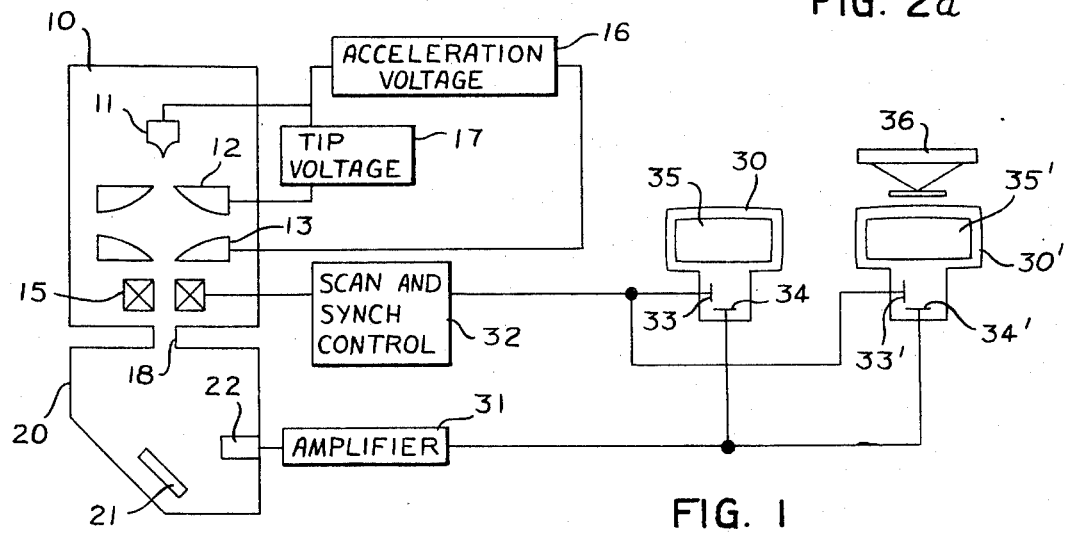
FIG. 1 is a diagrammatic view of a scanning electron microscope including a cathode ray tube type display system.

Referring now to the drawings and in particular to FIG. 1, a combined scanning electron microscope and display system including photographic recording apparatus is illustrated, in the usual arrangement of such a system as embodied within the field emission type scanning electron microscope. Reference numeral 10 indicates a field emission electron gun which is interconnected with a specimen chamber 20. Necessary operating voltages for the electron gun 10 are supplied by tip voltage unit 17 and accelerating and focusing voltage unit 16. Scan and synchronization control unit 32, detector 22, amplifier 31, and viewing tube monitors 30 and 30' comprise the usual remaining portions of the display system.

Field emission gun 10 in the illustrated embodiment is typical of those presently found in the art and reference may be made to an article appearing in "The Review of Scientific Instruments," Volume 39, No. 4, April 1968 entitled *Electron Gun Using a Vield Emission Source*, authored by A. V. Crewe, D. N. Eggenberger, J. Wall and L. M. Welter. For a more complete explanation of the operating characteristics and parameters of such a field emission gun in further reference to this type of microscopy instrument further reference may be had to U.S. Pat. No. 3,678,333 entitled FIELD EMISSION ELECTRON GUN and various continuation applications filed thereon. By way of general description, a field emission tip 11 is a suitable shaped cathode of appropriate metal such as tungsten as described in the aforementioned article and patent. Tip 11 thus produces a beam of charged particles when placed in a sufficiently high electric field and vacuum. In the scanning electron microscopy systems charged particles are, of course, electrons. However, in field ion type devices, the tip may act as a source for ions issuing from a virtual source within the structure of the field emission tip 11.

Tip voltage unit 17 is interconnected between the field emission tip 11 and the first anode structure 12 and supplies the necessary electric field strength for production of the charged particles. The acceleration and focusing voltage unit 16 interconnected between the field emission tip and the second anode 13 further downstream provides the necessary accelerating and focusing voltages in conjunction with anode 12 to cause the particles to form a beam of desired size. The type of gun structure described, essentially constitutes a focusing unit without need for further lensing systems unless peculiar resolution requirements are imposed. Additional embodiments of field emission electron microscope systems are illustrated in U.S. Pat. Nos. 3,766,427 and 3,784,815 both of which are assigned to the Assignee of the present application.

Since it is a scanning type device in which the present invention is particularly advantageous, reference may be made to the charged particle beam which is deflected in a predetermined pattern in order to appropriately scan a selected portion of a specimen undergoing investigation. Deflection coils 15 are driven by the scan synchronization control unit 32 to deflect the charged particle beam in an appropriate manner. In such a scanning system, the beam scans horizontally across the specimen and then rapidly returns to the starting point (being vertically displaced from the initial point of the horizontal scan) and subsequently scans horizontally in a similar manner. Each such subsequent line scan is equally displaced from the previous by a predetermined amount. As the horizontal beam is thus scanned across the specimen, it is continuously vertically displaced. Thus, eventually, the specimen surface selected for investigation is entirely scanned. This type of scanning pattern is well-known to those familiar with the scanning electron microscopy art and is quite similar to that normally used in the production and imaging of television pictures.

By way of further explanation, again with reference specifically to a field emission scanning electron microscope system, the beam after deflection by the coil 15, is passed through a connecting aperture 18 between the gun 10 specimen chamber 20. The specimen 21 is located in the physical path of the electron beam and the portion to be investigated is scanned in a manner heretofore described. The impingement of the beam upon the specimen causes particles to be returned from the surface of the specimen, such as the emission of secondary particles, in the specific instance of this embodiment secondary electrons. Additionally, the impingement of the beam upon the specimen may also cause electrons to be reflected or x-rays to be emitted. It is these secondary and reflected electrons and x-rays which may be detected by a detector 22. The detector 22 is a sensing device of the scintillation type which is also well known to those skilled in the microscopy art. This detector 22 converts the signals derived from the secondary electrons from the specimen 21 to a varying amplitude signal which may be amplified and utilized by the display circuitry. The detector unit 22 in addition to the scintillation detector described above normally includes a photomultiplier tube. The amplifier 31 further conditions the signal from the combined scintillation detector photomultiplier 22 and forwards the signal to viewing tube 30 and 30' which may be quite similar to the standard monitoring-type cathode ray tube.

In the usual viewing tube 30 and 30', the viewing surface 35 is provided with a sensitized surface which emits light upon the impingement of the tube's self-contained electron beam. Normally, the sensitized surface is coated with a phosphor or other similar light-emitting material. The beam of the viewing tube is usually generated internally from a thermionic type cathode and deflected by electrostatic plates illustrated typically as 33 of the viewing tube 30. If the image formed on the face of the viewing tube 30 is to have coherency with the signals detected from the specimen 21, it is essential that a fixed and known relationship in both time and space be maintained between the field emission gun 10, electron beam and the electron beam of viewing tube 30. Normally, it is found suitable to have both beams in the exact synchronization with the signal produced by synchronization control 32. Thus, the output synchronization signals keep both vertical and horizontal scanning lines of view tube 30 and the path of the electron beam on the specimen 21 in the exact phase relationship. The output of the amplifier 31 is applied to a signal grid 34 of the viewing tube 30. This signal modulates the electron beam of the cathode ray tube responsive to specimen signal strength and thereby affects the light-emitting capability of the viewing tube surface 35 according to the emitting capability of the specimen to produce the image on the viewing surface 35 which is a recognizable picture of specimen 21.

As previously discussed, to insure the production of a high resolution photograph in photographing apparatus 36, it is important that the representation of the specimen 21 on viewing surface 35' be as stable and uniform as possible. Among the important influences which may be exerted upon the signal from amplifier 31 which serves to modulate the electron beam of the viewing tube 30' are the reduction or removal of the noise component of the signal supply to grid 34 (which is a substantial portion of the signal supplied and conditioned by detector 22 and conditioned by amplifier 31). Also, a further important influence is the causing of the signal of amplifier 31 to be stabilized to a specific voltage range for the white to black contrast information and the establishment of a zero or predetermined reference level for this voltage information.

Figure 2:
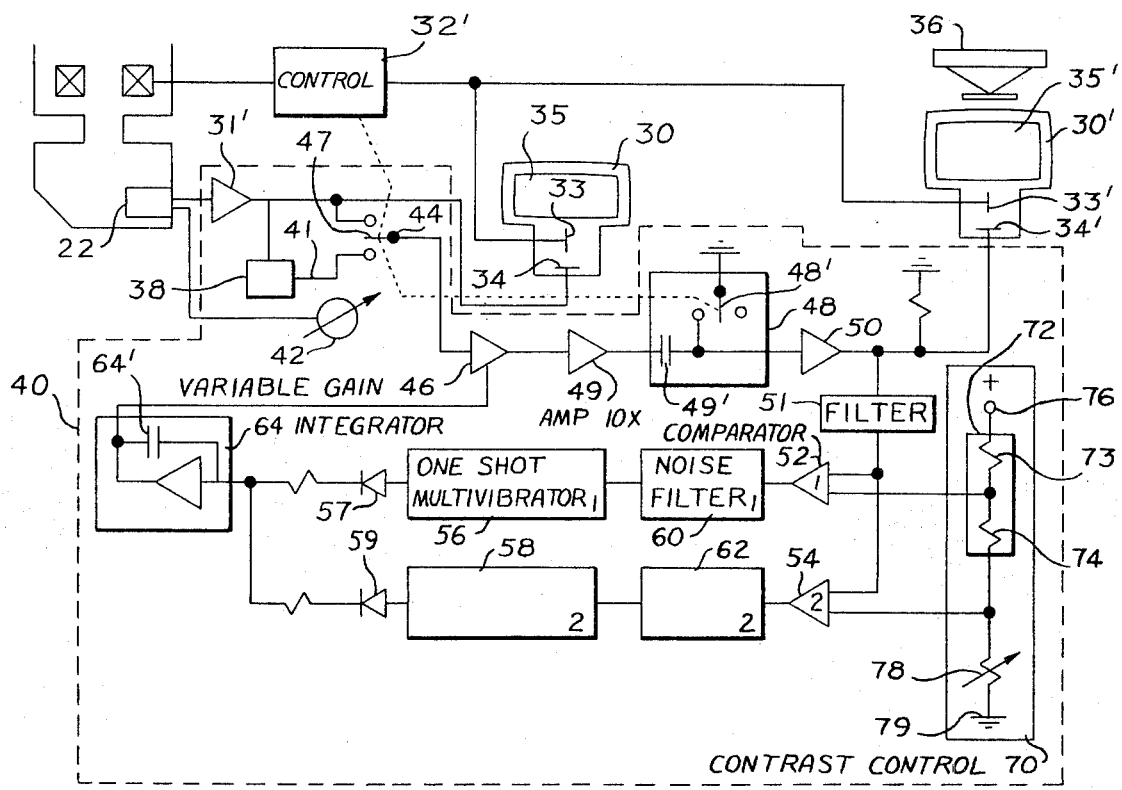
FIG. 2 is a diagrammatic representation of the scanning electron microscope display system incorporating the gain control circuit of applicant's invention.

Accordingly, the invention illustrated in FIG. 2 as embodied in apparatus illustrated in FIG. 1 provides these important influences on the signal of conditioning amplifier 31 and to viewing tube 30. In a broad functional sense, the apparatus of the invention may be said to include automatic gain control of the signal beam produced by detector/photomultiplier 22 with respect to the signal or representation of the specimen on viewing surface 35'. By way of an overview of the apparatus illustrated in FIG. 2, the electronic circuitry has two major feedback loops to provide the desired conditioning of the signal being supplied to grid 34'. The first loop is the loop consisting of the photomultiplier tube 22, preamplifier 31' which generally responds to scan and synchronization control 32', the visual or monitoring tube 30, the operator (indicated generally at 42) having at his access the photomultiplier gain control at the position 42. The second loop of the gain control circuiting includes the items beginning at an input of the first control loop at terminal 44 and includes a variable gain amplifier 46, a DC restorer 48, two fixed gain amplifiers 49 and 50, one being disposed on each of the input and output sides of DC restoring circuit 48, high speed comparators 52 and 54 inputting to one-shot multivibrators 56 and 58. In the disclosed embodiment, the input of the comparators to multivibrators is through noise filters 60 and 62. The one-shot multivibrators 56 and 58 feed an operational amplifier/integrator 64 which, in turn, feeds back to the control portion of the variable gain amplifier 46.

The function of the first loop of the gain control circuit is two-hold. The first function is to present to the operator of the scanning electron microscope instrument an image which represents the video output from the detector 22. The second function of the first loop of the gain control circuit is to provide the second loop of the circuit with a signal having a controllable dynamic range less than that output by the multiplier tube of the detector 22 under the influence of operator control of the photomultiplier gain. A problem arises under operator control of photomultiplier gain when the operator compensates for a dark image in the visual monitor. Due to his desire to observe dark objects and images on the surface of the monitor, the tendency is for the operator to raise the photomultiplier gain when viewing a dark object in order to observe the full image detail at such a dark spot. Likewise, when viewing bright objects or bright areas on the visual monitor, the tendency is for the operator to decrease photomultiplier gain to prevent overdriving of the viewing tube surface and obscuration of image characteristics. As will be explained below, the first loop of the gain control circuit identifies the blackest picture point on the specimen within the field of view of the electron beam and provides the second loop of the circuit with an indication of what this black level is within the field of view.

The second loop of the disclosed gain control circuit has two primary functions. First of these is the acceptance of the black level information mentioned above and which is coded into the video signal by the first loop and then manipulation of the circuit output (the DC restorer) such that this black level is presented at a constant DC level to the monitor 30' from which the photographic records are made. The second function of the gain control circuit is to present the whitest portion or white representation being the maximum positive amplitudes of the dynamic range of the video signal at a predetermined constant DC level to the visual monitor 30' and consequently the photographic representations made from the visual monitor. The white level control of the gain control circuit is accomplished through control of comparators 52 and 54 and multivibrators 56 and 58 by a contrast control circuit 70 which includes a voltage dividing circuit 72 including resistors 73 and 74 coupled across a DC supply 76 and a variable contrast level control 78 which is coupled to ground at 79.

It is to be noted, at this point, that the function of the two loops of the gain control circuit must be performed in the presence of large quantities of ambient electrical noise and over an extreme bandwidth, (for example 30 megahertz) without distortion on phase-shifting of the video signal.

Figure 2A:
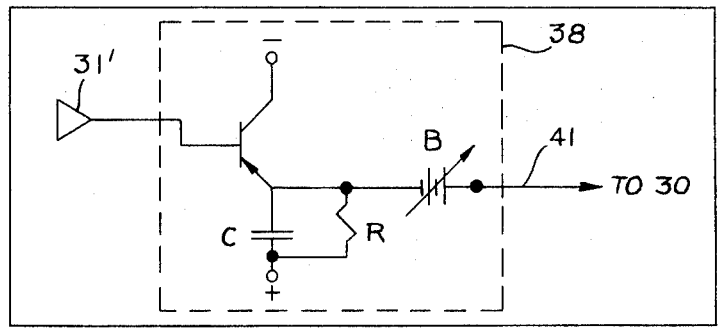
FIG. 2a is a diagrammatic representation of a portion of the circuitry of FIG. 2.

Turning now to the operation of the gain control circuit and referring specifically to the first loop, video preamplifier 31' is a fixed gain amplifier of the type which is well known in the art. This amplifier converts the output of the detector 22 (photomultiplier tube) from the milivolt signal level to a signal level usable in a visual monitor 30. In the embodiment disclosed, a photomultiplier signal in the order of 2 to 3 milivolts is supplied to the video preamplifier 31' which outputs a signal in the range of three-quarters of a volt for utilization as a modulation signal of the electron beam at electrode 34 of the visual monitor. The video preamplifier 31' output is monitored by a circuit arbitrarily called a "blackcatcher" 38 which essentially includes a resistive-capacitive circuit which has the characteristic of being chargeable at a rate faster than the rate at which it discharges. A wide variety of circuitry is known to the art which satisfies this criteria, however, reference to FIG. 2a will illustrate one embodiment of such a blackcatcher 38. Referring to FIG. 2a, the signal from video preamplifier 31' is supplied to the base of a PNP transistor, the collector of which is coupled to a negative voltage supply. The emitter of this transistor is coupled to capacitor C which, in turn, is coupled to a positive voltage supply or ground. The emitter and negative side of the capacitor is also connected to a large resistor R to the positive supply which also forms the output terminal of the backcatcher circuit 38 when suitably shifted by a DC voltage B to compensate for base-emitter voltage drop of the transistor (which in FIG. 2 is represented by the conductor 41). In operation, the blackcatcher detects the black going or negative going excursions of the video amplifier's 31' output signal and charges capacitor C during these black or negative going excursions. During the portion of time that the video preamplifier's 31' output signal ceases to be negative going, the charging of capacitor C ceases (since the transistor is turned "off") and the capacitor, in turn, slowly discharges through resistor R. The resulting voltage output indicating charge level on capacitor C provides an indication of the extent to which the video signal has swung in a negative direction. The biasing of the transistor is such that on subsequent swings of the video output in a negative direction, so long as the swing is more negative than the charge currently indicated on the capacitor, the transistor will conduct and effectively further charge the capacitor. In such manner, the circuitry (capacitor) will remember the furthest negative going or black excursions and output a signal indicating this negative extent. It is preferable that the time constant of the resistance/capacitance circuit be one which extends over several video frames of video monitor 30'. If the time constant is thus sufficiently long, the output of blackcatcher circuit 38 will represent the signal level which is the blackest observed for an entire scene or image generated on the screen 35, before material discharge or decline of the stored charge value has occurred.

The first loop of the gain control circuit includes the switching mechanism 47 disposed following the video preamp 31', the input 34 to visual monitor 30 and blackcatcher 38 and immediately prior to terminal 44. Switch 47 is controlled by the blanking signal in scan and synchronization control 32'. The switch is illustrated as a single pole/double throw switch but, in fact, it is convenient to use arrangements of field effect transistors and associated drive components which are well known in the art. The scan and synchronization control 32', during the horizontal and vertical retrace of the raster associated with the video signal, causes the switch 47 to output the black level generated by the blackcatcher 38 to the DC restorer circuit 48. At all other times, the switch 47 outputs the video signal from the video preamp 31' to the second loop of the gain control circuit. The DC restoring circuit 48 also contains a switch 48' similar to that previously described at 47 which is triggered by the scan and synchronization control 32' in accordance with the blanking signal. Subsequent reference to switch 48' will be made with respect to later description of the DC restoring circuit 48.

Turning now to the second loop of the gain control circuit, the variable gain amplifier 46 is a differential amplifier whose voltage gain is controlled by varying the current through it. Accordingly, a gain control voltage may be provided which varies the gain of amplifier 46 from approximately 0 to about 15x. This amplifier is followed by an amplifier of fixed gain for convenience purposes in the illustrated embodiment. A gain of 10x is convenient and this amplifier is capacitively coupled through capacitor 49' to the DC restoring switch. The function of the fixed gain amplifier is to provide a low impedance path to ground during portions of time when switch 48' is in the condition wherein the capacitor 49' is connected to ground. Thus, at the same time the black level signal is imposed on the fixed gain amplifier 49, a low impedance path is provided from the amplifier through the capacitor 49' to ground thereby allowing the capacitor 49' to be charged with the voltage necessary to shift the video signal to a ground based black level at the DC restorer's output. By such circuitry, the video signal becomes a ground based black level signal or a reference biased varying amplitude signal at the DC restorer's output level, when blanking ceases and the normal video signal is restored at the termination of retrace. The circuit is thus arranged so that the capacitor charge at 49' will not discharge appreciably while retrace is not taking place.

The DC restorer circuit 48 is connected therethrough a constant gain amplifier 50 (approximately 1x) and ultimately to the modulation input 34' of the photographic visual monitor 30'. This constant gain amplifier 50 has a high input impedance which the DC restorer demands and a low output impedance which is necessary to drive the relatively long transmission lines to the visual monitor 30'. The output of the DC restorer circuit 48 and the constant gain amplifier 50 is fed back to the variable gain amplifier 46 through a contrast controlling circuit 70, integrator 64 and related comparators and one-shot multivibrators 52, 54, 56 and 58. The output of the amplifier 50 is fed to a noise filter 51 to remove those noise spikes from the signal prior to the signal's entry into two high speed comparators 52 and 54. It is the function of the high speed comparators 52 and 54 to determine whether or not the white level or predetermined maximum and minimums of the biased video signal is within the limits set (as on contrast control 70). Comparator 1 determines whether or not the output is too large or above the desired maximum amplitude levels. Comparator 2 determines whether or not the output is too small or the maximum amplitudes of the video signal do not reach the set minimum. The control 70 is composed of a voltage dividing circuit including resistors 73, 74 and variable resistor 78. The control 70 adjusts and predetermines the voltage for the white levels W1 and W2 and correspondingly sets the voltages applied to comparators 1 and 2 through this resistive divider circuit. By a predetermined selection of the contrast 70, the ideal maximum white level to be presented to the visual monitor 30' is located between W1 and W2 and is determined by an operator setting of the variable voltage (contrast) control 78. This variable control may be located at any convenient point of the overall scanning microscope display system, such as on a control panel for the visual monitors 30 or 30'. The output of comparators 52 and 54 (1 and 2 respectively) are fed to noise filters 60 and 62 which in the particular embodiment are employed to restrict the outputs of the comparators to areas of interest greater than approximately 200 nano-seconds wide. Such filters cause a noise signal indicated as white rapidly positively going signal smaller than about ½ percent of the picture width, to be viewed by the filter as too white and thus filtered out of the comparator output. This, in effect, is a form of noise filtering, and causes the control to be responsive to the relatively slower frequency of the video signal. The one-shot multivibrators 56 and 58 receiving the output of noise filters 60 and 62 respectively and responsive thereto have a time constant of approximately 1/50 of a second. In the illustrated embodiment, the combination of the noise filter and multivibrators make the circuit respond identically to both short duration (200nS) and long (15mS) white areas. The one-shot multivibrators are connected to be retriggerable (i.e., if there is a white area which is sufficiently bright to activate either comparator (2) in every field of video, then its pulse does not return to rest condition but rather remains in this quasistable state). The comparators are biased such that in the ideal case of the whitest part of the picture being located between W1 and W2, the input comparator 2 is being retriggered every 1/60 of a second. The multivibrator's 58 output is thus always in the "one state" or conducting state, and the diode (59) illustrated at its output is forward biased. Similarly, multivibrator 1 is not triggered due to the white level never exceeding the level W1 at any time in this described instance. The diode 57 at its output is reverse biased as the output of multivibrator 1 is in the 0 state or non-conducting state. The amplifier integrator 64 is connected parallel with capacitor 64' and during the above-described optimum condition its charge state remains unchanged. Since the output supplied by amplifier 64 does not vary, the variable gain amplifier gain remains unchanged.

If for any reason the white level of the resulting output increases beyond W1 comparator 1 detects the increase and multivibrator 1 output changes to the 1 state thus forwarding biasing its diode 57 and causing the integrator output to increase. This action reduces the gain of the variable gain amplifier and, consequently, output white level.

If alternatively, the white level output decreases for any reason and comparator 2 is not triggered for one or more fields of video (1/60 of a second fields in the illustrated embodiment of the circuit described), multivibrator 2 returns to its stable 0 state, its diode thus being reverse biased and the output voltage of the amplifier 64 caused to drop thus increasing the gain of the variable gain amplifier. Consequently, with a rise in the gain of the variable gain amplifier, the video signal passing through the amplifier 46 is caused to increase. This provides the desired result of white level output increase. When the signal returns to the desired point between W1 and W2 (the ideal case abovementioned), the comparators and one-shot multivibrators are both caused to return to the first condition hypothesized, and the gain of the variable gain amplifier 46 remains constant and thus the white level of the video signal remains at the selected value.

It should be recognized that the time constants of the various circuit components of the illustrated embodiment were chosen for the particular signal characteristics and requirements of the various circuit components (i.e. the visual monitors 30 and 30'). It should be recognized that a variety of changes and modifications in circuit components may be made without departing from the spirit and scope of the invention described and subsequently claimed.

What is claimed is:

1. In apparatus including means for generating an electrical signal of varying amplitude wherein a specimen is scanned in a raster pattern such as an electron microscope having means for detecting secondary electron emissions, which is supplied to recording means for a duplication of the raster image such as the video input to a cathode ray tube for ultimately presenting a visual display of the amplitude information of said signal, the improvement of standardization of the generated signal to a reference level such as "black" input to the visual display and the range of white to a predetermined level including means for controlling the bias and amplitude range of said signal to form a varying amplitude signal biased to a predetermined level and controlled to a predetermined A.C. dynamic range comprising:

means for monitoring said varying amplitude signal over a continuing predetermined time period and remembering the maximum amplitude of said varying amplitude signal in a selected direction over said time period such as the remembering of the blackest black for the frame of the raster;

means operably connected to said remembering means for generating a second electrical signal proportional to the remembered maximum amplitude of said varying amplitude signal such as generating a black signal which is ground biased, said means setting the bias of said varying amplitude signal and being selectively connected to said monitoring means such as during the video retrace of the cathode ray tube;

means for selectively connecting the output of said varying amplitude signal generating means to said means for generating said second electrical signal for continually biasing said varying amplitude signal relative to the maximum remembered amplitude wherein an instantaneous value of said varying amplitude signal maintains direct relation to said maximum rembered amplitude;

means for selecting a predetermined level of said continually biased varying amplitude signal thereby predetermined an A.C. dynamic range for said varying amplitude signal such as setting a "white" level;

means for comparing the predetermined level of said A.C. dynamic range of said varying amplitude signal to an actual level of A.C. dynamic range of said continually biased varying amplitude signal; and means for adjusting said actual level of said A.C. dynamic range of said continually biased varying amplitude signal when said compared level departs from said predetermined level.

2. The improvement according to claim 1 wherein said means for biasing said varying amplitude signal includes means for biasing at a predetermined reference voltage.

3. The improvement according to claim 1 wherein said means for biasing said signal includes means for referencing said biasing to ground potential.

4. The improvement according to claim 1 wherein said means for monitoring and remembering includes a resistance capacitance network means having a discharge time constant of substantially longer duration than its charging time constant whereby said network charges to and retains a charge substantially corresponding to the maximum amplitude of the varying amplitude signal supplied to said network.

5. The improvement according to claim 1 wherein said means for biasing said varying amplitude signal includes capacitance network means having reference voltage supply means;

first switch means to alternately couple the output side of said capacitor to said reference voltage supply and to said cathode ray tube;

second switch means, synchronized with said first switch means, to alternately couple the input of said capacitor to said varying amplitude signal generating means when said first switch means couples said capacitor output to said cathode ray tube and to couple said monitor means to the input of said capacitor when the output of said capacitor is coupled to said reference voltage supply means, whereby said video signal has a DC component restored it to produce a reference biased varying amplitude voltage.

6. The improvement according to claim 1 wherein in said means for comparing the predetermined level of A.C. dynamic range of the biased varying amplitude signal said predetermined level is a range, the upper level of which is the maximum level of acceptable A.C. dynamic range and the lower level of which is the minimum level of acceptable dynamic range, comprising:

comparator means for comparing the maximum dynamic A.C. range of said biased varying amplitude signal to said predetermined level; and means for adjusting the A.C. dynamic range of said varying amplitude signal to cause the maximum amplitude of said biased varying amplitude signal to conform to said predetermined level.

7. The improvement according to claim 5 wherein said recording means is a cathode ray tube means and switches are synchronized to the blanking signal of cathode ray tube synchronization and scan control such that said capacitor is connected to said reference voltage supply and said monitor means during the blanking portion of said cathode ray tubes horizontal and vertical retrace.

* * * * *